United States Patent
Kinlen

(10) Patent No.: US 7,029,763 B2
(45) Date of Patent: *Apr. 18, 2006

(54) LIGHT-EMITTING PHOSPHOR PARTICLES AND ELECTROLUMINESCENT DEVICES EMPLOYING SAME

(75) Inventor: Patrick J. Kinlen, Fenton, MO (US)

(73) Assignee: Lumimove, Inc., St. Louis, MO (US)

( * ) Notice: Subject to any disclaimer, the term of this patent is extended or adjusted under 35 U.S.C. 154(b) by 126 days.

This patent is subject to a terminal disclaimer.

(21) Appl. No.: 10/207,576

(22) Filed: Jul. 29, 2002

(65) Prior Publication Data

US 2004/0018379 A1  Jan. 29, 2004

(51) Int. Cl.
*H05B 33/14* (2006.01)
*C09K 11/00* (2006.01)

(52) U.S. Cl. .............. 428/690; 428/402; 428/403; 428/407; 313/503; 313/504; 313/509; 427/66; 427/212

(58) Field of Classification Search .......... 428/690, 428/917, 402, 403, 407; 313/503, 506, 518, 313/504, 509; 252/301.35, 100; 250/361; 427/212, 66

See application file for complete search history.

(56) References Cited

U.S. PATENT DOCUMENTS

| | | | |
|---|---|---|---|
| 2,924,732 A | 2/1960 | Lehmann | 313/108 |
| 3,052,810 A | 9/1962 | Mash | 313/108 |
| 3,621,321 A | 11/1971 | Williams et al. | 313/108 A |
| 4,263,339 A * | 4/1981 | Fischer | 427/64 |
| 4,539,507 A | 9/1985 | VanSlyke et al. | 313/504 |
| 4,672,265 A | 6/1987 | Eguchi et al. | 313/504 |
| 4,855,189 A * | 8/1989 | Simopoulos et al. | 428/690 |
| 4,857,416 A | 8/1989 | Kreiling et al. | 428/690 |
| 5,247,190 A | 9/1993 | Friend et al. | 257/40 |
| 5,309,070 A | 5/1994 | Sun et al. | 313/503 |
| 5,309,071 A | 5/1994 | Karam et al. | 313/509 |
| 5,426,792 A | 6/1995 | Murasko | 2/422 |
| 5,457,565 A | 10/1995 | Namiki et al. | 359/273 |
| 5,543,237 A | 8/1996 | Watanabe | 428/691 |
| 5,552,679 A | 9/1996 | Murasko | 315/169.3 |
| 5,554,449 A | 9/1996 | Tonomura et al. | 428/690 |
| 5,583,394 A | 12/1996 | Burbank et al. | 313/498 |
| 5,593,782 A | 1/1997 | Budd | 428/403 |

(Continued)

FOREIGN PATENT DOCUMENTS

EP  0294061 A1  12/1988

(Continued)

OTHER PUBLICATIONS

Article published in Bull. Korean Chem. Soc., vol. 20, No. 9, 1999 by Jeong Hee Han et al. entitled Correlation between Energy Transfer and Phase Separation in Emissive Polymer Blends.

(Continued)

*Primary Examiner*—Rena Dye
*Assistant Examiner*—Camie S. Thompson
(74) *Attorney, Agent, or Firm*—Nelson Mullins Riley & Scarborough, LLP

(57) ABSTRACT

Light-emitting substance-coated phosphor particles and light-emitting devices employing phosphor particles and light-emitting substances are provided. Also provided are light-emitting devices employing a layer of phosphor material that is covered by at least one layer of light-emitting polymers and/or light-emitting small molecules, and methods of making same.

31 Claims, 8 Drawing Sheets

U.S. PATENT DOCUMENTS

| | | | |
|---|---|---|---|
| 5,598,058 A | 1/1997 | LaPointe | 313/503 |
| 5,598,059 A | 1/1997 | Sun et al. | 313/509 |
| 5,602,445 A | 2/1997 | Solanki et al. | 313/503 |
| 5,612,591 A | 3/1997 | Katayama et al. | 313/503 |
| 5,635,110 A | 6/1997 | Chadha et al. | 252/301.4 R |
| 5,643,496 A | 7/1997 | Brese et al. | 252/301.65 |
| 5,667,724 A | 9/1997 | Petersen | 252/301.6 |
| 5,675,217 A | 10/1997 | Kang | 313/509 |
| 5,677,594 A | 10/1997 | Sun et al. | 313/503 |
| 5,682,043 A | 10/1997 | Pei et al. | 257/40 |
| 5,700,591 A | 12/1997 | Okajima et al. | 428/690 |
| 5,700,592 A | 12/1997 | Mueller et al. | 428/690 |
| 5,702,643 A | 12/1997 | Reddy et al. | 252/301.65 |
| 5,711,898 A | 1/1998 | Reddy et al. | 252/301.65 |
| 5,912,533 A | 6/1999 | Lee et al. | 313/503 |
| 5,976,613 A * | 11/1999 | Janusauskas | 427/66 |
| 6,023,371 A | 2/2000 | Onitsuka et al. | 359/620 |
| 6,053,795 A * | 4/2000 | Whitney et al. | 446/219 |
| 6,198,220 B1 | 3/2001 | Jones et al. | 313/512 |
| 6,203,391 B1 | 3/2001 | Murasko | 445/24 |
| 6,218,774 B1 | 4/2001 | Pope | 313/461 |
| 6,258,954 B1 | 7/2001 | Kunimoto et al. | 546/36 |
| 6,392,786 B1 | 5/2002 | Albert | 359/296 |
| 6,406,803 B1 | 6/2002 | Abe et al. | 428/690 |
| 6,424,088 B1 | 7/2002 | Murasko | 313/506 |
| 6,489,045 B1 | 12/2002 | Araki et al. | 428/690 |
| 6,498,049 B1 | 12/2002 | Friend et al. | 438/34 |
| 6,559,449 B1 * | 5/2003 | Ikeda et al. | 250/361 R |
| 6,562,460 B1 | 5/2003 | Bayless | 428/402.24 |
| 6,610,223 B1 * | 8/2003 | Lee | 264/9 |
| 6,611,109 B1 | 8/2003 | Zovko et al. | 315/169.3 |
| 6,613,455 B1 | 9/2003 | Matsumoto et al. | 428/690 |
| 6,706,551 B1 | 3/2004 | Andriessen | 438/99 |
| 6,777,724 B1 | 8/2004 | Duggal et al. | 257/184 |
| 6,903,505 B1 | 6/2005 | McNulty et al. | 313/504 |
| 2001/0030325 A1 | 10/2001 | Epstein et al. | |
| 2001/0035716 A1 | 11/2001 | Murasko | |
| 2001/0042329 A1 | 11/2001 | Murasko et al. | |
| 2002/0011786 A1* | 1/2002 | Murasko et al. | 313/518 |
| 2002/0155214 A1 | 10/2002 | Murasko et al. | |
| 2002/0157173 A1 | 10/2002 | Murasko et al. | |
| 2002/0159245 A1 | 10/2002 | Murasko et al. | |
| 2002/0159246 A1 | 10/2002 | Murasko et al. | |
| 2003/0015962 A1 | 1/2003 | Murasko et al. | |
| 2003/0032361 A1 | 2/2003 | Murasko et al. | |
| 2003/0094626 A1 | 5/2003 | Duggal et al. | |
| 2003/0099884 A1 | 5/2003 | Chiang et al. | 429/233 |
| 2003/0111955 A1 | 6/2003 | McNulty et al. | |
| 2003/0140768 A1 | 7/2003 | Barnardo | 84/477 R |
| 2004/0018382 A1* | 1/2004 | Kinlen | 428/690 |
| 2004/0217929 A1 | 11/2004 | Albert et al. | 345/84 |

FOREIGN PATENT DOCUMENTS

| | | |
|---|---|---|
| WO | WO 98/53645 | 11/1998 |

OTHER PUBLICATIONS

Article published in Nano Letters, vol. 1, No. 8, 2001, pp. 429-433 by J. F. Suyver et al. entitled Synthesis and Photoluminescence of Nanocrystalline ZnS:$Mn^{2+}$.

Article by David Lieberman published online by EETimes at http://www.eetimes.com/story/OEG20000919S0014, Nov. 14, 2002.

Article published in Chem. Rev., 102, 2002, pp. 2357-2368, by Junji Kido et al. entitled Organo Lanthanide Metal Complexes for Electroluminescent Materials.

Article in the Handbook of Conducting Polymers by T.A. Skotheim et al. Eds., Marcel Dekker, Inc., New York, 1998, pp. 823-845, by R. H. Friend et al. entitled Electroluminescence in Conjugated Polymers.

Article published in the Journal of Molecular Electronics, vol. 4, 1998, pp. 37-46, by R.H. Friend entitled Optical Investigations of Conjugated Polymers.

Article published in the Japanese Journal of Applied Physics, vol. 21, No. 6, Jun. 1982, pp. 860-864, by Kenzo Kojima et al. entitled Electroluminescence in Polyethylene Terephthalate (PET) I. Impulse Voltage.

Article published in J. Chem. Soc.; Chem. Commun., 1983, pp. 954-955, by Denis G. H. Ballard et al. entitled A Biotech Route to Polyphenylene.

Article published in Polymer, vol. 30, Jun. 1989, (Conference issue) by John D. Stenger-Smith et al. entitled Spectroscopic and cyclic voltammetric studies of poly (p-phenylene vinylene) prepared from two different sulphonium salt precursor polymers.

Article published in J. Phys. D (Applied Physics), vol. 20, 1987, pp. 1389-1410, by D. D. C. Bradley entitled Precursor-route poly (p-phenylenevinylene): polymer characterization and control of electronic properties.

Article published in Synthetic Metals (28), 1989, pp. C687-C690, by H. Tomozawa et al. entitled Metal-Polymer Schottky Barriers on Processible Polymers.

Article in Luminescence of Solids, edited by D. R. Vij, Plenum Press, New York, 1998, pp. 221-269 by H. E. Gumlich et al. entitled Electroluminescence.

Article published online at http://www.geocities.com/Athens/Bridge/2702/CAP4I.htm entitled Display Devices.

Article in Advanced Materials, 14, No. 16, Aug. 16, 2002, pp. 1147-1150, by G. A. Hebbink et al. entitled Lanthanide (III)-Doped Nanoparticles That Emit in the Near-Infrared.

"Zinc Sulfide" online at http://ncsr.csci-va.com/materials/zns.asp, Oct. 28, 2002.

Proceedings of the 2nd International Symposium on Advanced Luminescent Materials and Quantum Confinement, 201st Meeting of the Electrochemical Society, 185, 2002, by J. F. Suyver et al. entitled (Electro) Luminescence of Solutions, Powders and Layers of ZnSe:Cu Nanocrystals.

I-components website, Technology, at http://www.i-components.co.kr/korean/technology.htm, Nov. 14, 2002.

Orgacon Conductive Transparent Films, Application Sheet, entitled Patterning Orgacon Film by Means of UV Lithography, AGFA, revised May, 2001.

http://www.kressworks.com/Research/Qu . . . /Electroluminescence_Of_Organic_Polymer.ht, Jul. 3, 2002.

International Search Report dated Jan. 17, 2003 for International Application No. PCT/US02/13547.

* cited by examiner

LIGHT-EMITTING PHOSPHOR PARTICLES AND ELECTROLUMINESCENT DEVICES EMPLOYING SAME

FIELD OF THE INVENTION

The present invention relates to light-emitting phosphor particles and light-emitting devices employing same, and more particularly, to light-emitting substance-coated phosphor particles and light-emitting devices employing same.

BACKGROUND OF THE INVENTION

Fluorescence occurs when a material emits visible light after being excited by an excitation source applied from outside. A fluorescent lamp, a discharge tube, and a cathode ray tube utilize fluorescence. A material that emits fluorescence is called a phosphor.

Electroluminescence is a solid state phenomenon, which involves the emission of visible or invisible radiation as a result of the absorption of exciting energy. It is a general term which includes both fluorescence and phosphorescence. Invisible light further includes infrared and ultraviolet radiation.

An electroluminescent (EL) display device generally includes a layer of phosphor positioned between two electrodes, with at least one of the electrodes being light-transmissive. At least one dielectric also is positioned between the electrodes so the EL display device functions as a capacitor. When a voltage is applied across the electrodes, the phosphor material is activated and emits a light.

Phosphors may be employed in the manufacture of electroluminescent devices. Long-lasting phosphors are known in the art, and include sulfides and oxides. Many long-lasting phosphor products are those with a sulfide as their base crystal, such as ZnS:Cu. These are disadvantageous in that the after-glow lasts for a relatively short duration of time, for example, for about three hours at the longest.

Phosphorescence characteristics are influenced by composition, particle diameter, and environment, in particular, the phosphorescence brightness of phosphors. With respect to particle diameter, there is a tendency that the phosphorescence brightness decreases proportionally with a decrease in the particle diameter below 100 microns.

Light-emitting small molecules (LEMs) may also be employed in the manufacture of electroluminescent devices. Suitable light-emitting small molecules include quinolines, fluorescein, and the like.

Light-emitting polymers (LEPs) may further be employed in the manufacture of electroluminescent devices. Suitable light-emitting polymers include MEH-PPV (2-methoxy-5-2'-ethylhexyloxy)-1,4-phenylenevinylene copolymer, MEH-BP-PPV (poly[2-Methoxy-5-(2'-ethylhexyloxy)-1,4-phenylenevinylene-co-4,4'-bisphenylenevinylene]), and MEH-CN-PPV. These LEPs absorb radiation at about 400 to about 500 nm (blue light) and emit radiation at about 600 and 800 nm (yellow, orange, and red light).

The short lifetime of organic light-emitting polymers (LEPs) is presently a major impediment to their use in commercial environments. Organic LEPs are unstable when exposed to air and humidity. In addition to oxygen, other contaminants present in air, such as ozone and $NH_3$, also adversely affect the useful lifetime of LEPs.

Heretofore, lamps fabricated from LEPs have been entirely encapsulated, or have had exposed surfaces coated with protective layers to achieve stability. This large-scale encapsulation/coating process is costly, and requires the use of a relatively expensive transparent material.

In addition, the phosphors used in previous EL devices require relatively high voltage, typically in the range of about 60 to about 240 volts. What is needed is an electroluminescent device that requires minimal operating voltage and that exhibits long term stability without stringent inert atmosphere handling or encapsulation requirements.

Thus, it would be a contribution to the art to provide phosphor particles coated with a suitable light-emitting substance, wherein said substance may be molecular or polymeric in nature, or a combination of both, having enhanced stability for use in electroluminescent devices, as well as electroluminesecent devices employing same. It would be a further contribution to the art to provide phosphor particles layered in an electroluminescent device with additional layers of other suitable light-emitting substances, wherein said substances may be molecular or polymeric in nature, or a combination of both.

SUMMARY OF THE INVENTION

The present invention provides light-emitting substance-coated phosphor particles.

The present invention also provides light-emitting polymer-coated phosphor particles.

The present invention additionally provides light-emitting molecule-coated phosphor particles.

The present invention further provides light-emitting polymer-coated phosphor particles.

Still further provided by the present invention are devices employing said light-emitting substance-coated phosphor particles.

Additionally provided are devices with layers of phosphor particles along with layers of other light-emitting substances, wherein said substances may be molecular or polymeric in nature, or a combination of both.

DETAILED DESCRIPTION OF THE INVENTION

Figure 1:
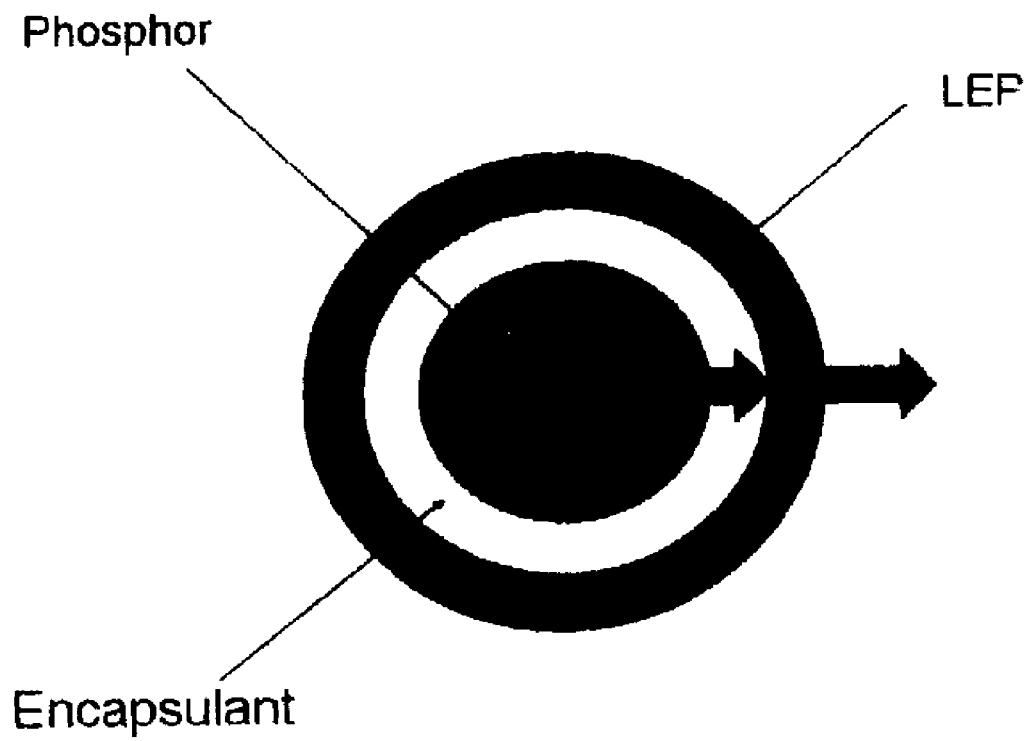
FIGS. 1, 1A, and 1B all illustrate a light-emitting polymer (LEP) coated phosphor particle and 1C illustrates a phosphor particle having a coating comprising a light-emitting polymer and a light-emitting small molecule.

The electroluminescent light-emitting substance (LES) can be chosen from a wide variety of light-emitting materials, including both small molecule or molecular (LEMs) and polymeric light-emitting materials (LEPs), or a combination of both. The preparation and use of such materials is well known to those skilled in the art. LEM-coated or LEP-coated phosphor particles may be employed in place of traditional phosphors in electroluminescent devices. For discussion purposes, LEPs will be exemplified hereinbelow, but it is understood that LEMs or a combination of LEPs and LEMs may also be employed.

As used herein, the term polymeric material refers to materials having repeating structural units, such as polyphenylene, whereas the term molecular material refers to material that is a small molecule, or material having only one structural unit. These small molecules may be organic or inorganic.

Suitable light-emitting polymers include polypyridine, poly(p-phenylene vinylene) or poly[2-methoxy-5-(2'-ethylhexyloxy)-1,4-phenylenevinylene] may be used. Additional LEPs include poly[2-methoxy-5-(2-ethylhexyloxy)-1,4-phenylene-vinylene]; poly[(2-methoxy-5-(2-ethylhexyloxy)-1,4-phenylene-vinylene)-alt-co-(4,4'-biphenylene-vinylene)]; poly[(9,9-dioctyl-2,7-divinylenefluorenylene)-alt-co-(9,10-anthracene)]; poly[(9,9-dioctyl-2,7-divinylenefluorenylene)-alt-co-(4,4'-biphenylene)]; poly[{9,9-dioctyl-2,7-divinylene-fluorenylene}-alt-co-{2-methoxy-5-(2-ethyl-hexyloxy)-1,4-phenylene}]; poly[{9,9-dioctyl-2,7-bis(2-cyanovinylene-fluorenylene}-alt-co-{2-methoxy-5-(2-ethyl hexyloxy)-1,4-phenylene}]; poly[2-methoxy-5-(2-ethylhexyloxy)-1,4-(1-cyanovinylenephenylene)]; poly[{9,9-dihexyl-2,7-bis(1-cyanovinylene)fluorenylene}-alt-co-{2,5-bis(N,N'-diphenylamino)-1,4-phenylene}]; poly[{9-ethyl-3,6-bis(2-cyanovinylene)carbazolylene)}-alt-co-{2-methoxy-5-(2-ethylhexyloxy)-1,4-phenylene}]; poly[(9,9-di(2-ethylhexyl)-fluorenyl-2,7-diyl)-co-(N,N'-diphenyl)-N,N'-di-(p-butyl phenyl)-1,4-diaminobenzene]; poly[2-(6-cyano-6-methylheptyloxy)-1,4-phenylene); poly[{9,9-dioctylfluorenyl-2,7-diyl}-co-{1,4-(2,5-dimethoxy)benzene}]; poly[{9,9-dioctylfluorenyl-2,7-diyl}-co-{1,4-(2,5-dimethoxy)benzene}]; poly[(9,9-dioctylfluorenyl-2,7-diyl)-co-(1,4-ethylenylbenzene)]; poly[(9,9-dioctylfluorenyl-2,7-diyl)-co-(1,4-diphenylene-vinylene-2-methoxy-5-{2-ethylhexyloxy}-benzene)]; poly[(9,9-dihexylfluorenyl-2,7-divinylenefluorenylene)]; poly[(9,9-dihexyl-2,7-(2-cyanodivinylene)-fluorenylene)]; poly[(9,9-dioctylfluorenyl-2,7-diyl)-co-(1,4-vinylenephenylene)]; poly[(9,9-dioctylfluorenyl-2,7-diyl)-co-(1,4-vinylenephenylene)]; poly(9,9-dioctylfluorenyl-2,7-diyl; poly(9,9-dihexylfluorenyl-2,7-diyl); poly[9,9-di-(2-ethylhexyl)-fluorenyl-2,7-diyl]; poly[(9,9-dioctylfluorenyl-2,7-diyl)-co-(N,N'-diphenyl)-N,N'-di(p-butyloxyphenyl)-1,4-diaminobenzene)]; poly[(9,9-dioctylfluorenyl-2,7-diyl)-alt-co-(N,N'-diphenyl)-N,N'-di(p-butyloxy-phenyl)1,4-diaminobenzene)]; poly[(9,9-dihexylfluorenyl-2,7-diyl)-co-(1,4-benzo-{2,1',3}-thiadiazole)]; poly[(9,9-dihexylfluorenyl-2,7-diyl)-alt-co-(9,10-anthracene)]; poly[(9,9-dioctylfluorenyl-2,7-diyl)-alt-co-(N,N'-bis{4-butylphenyl}-benzidine-N,N'-{1,4-diphenylene})]; poly[(9,9-dihexylfluorenyl-2,7-diyl)-alt-co-(2-methoxy-5-{2-ethylhexyloxy}-1,4-phenylene)]; poly[(9,9-dihexylfluorenyl-2,7-diyl)-co-(9,ethyl-3,6-carbazole)]; poly[(9,9-dihexylfluorenyl-2,7-diyl)-alt-co-(9,ethyl-3,6-carbazole)]; poly[(9,9-dihexylfluorenyl-2,7-diyl)-alt-co-(9,9'-spirobifluorene-2,7-diyl]; poly[(9,9-dihexylfluorenyl-2,7-diyl)-co-(2,5-p-xylene)]; poly[(9,9-dihexylfluorenyl-2,7-diyl)-co-(3,5-pyridine)]; poly[(9,9-dihexylfluorenyl-2,7-diyl)-co-(1,4-phenylene)]; poly[(9,9-dihexylfluorenyl-2,7-diyl)-alt-co-(9,9-di-{5-pentanyl}-fluorenyl-2',7'-diyl; poly[(9,9-dihexylfluorenyl-2,7-diyl)-co-(6,6'{2,2'-bipyridine})]; poly[(9,9-dihexylfluorenyl-2,7-diyl)-co-(6,6'-{2,2':6',2"-terpyridine})]; and poly[(9,9-dihexylfluorenyl-2,7-diyl)-co-(N,N'bis{p-butylphenyl}-1,4-diamino phenylene)], all of which are commercially available from American Dye Source, Inc.

Suitable light-emitting small molecules include 8-hydroxyquinoline, fluorescein, rhodamine, xanthene or substituted xanthene, substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl-1-piperazinyl]-2,5'-bi-1H-benzimidazol) and (2'-[4-ethoxyphenyl]-5-[4-methyl-1-piperazinyl]-2,5'-bi-1H-benzimidazol)), DAPI (4,6-diamidino-2-phenylindole), as well as light-emitting metal complexes, such as lithium tetra (2-methyl-8-hydroxyquinolinato)boron, bis(8-hydroxyquinolinato)zinc, tris(benzoylacetonato)mono(phenanthroline)europium(III), tris(2-phenylpyridine)iridium(III), and tris(8-hydroxyquinolinato)gallium(III).

In an alternative, other appropriate light emitting substances may include organic and inorganic complexes, such as tris(8-hydroxyquinolato) aluminum; tetra(2-methyl-8-hydroxyquinolato) boron; lithium salt; 4,4'-bis(9-ethyl-3-carbazovinylene)-1,1'-biphenyl; 9,10-di[(9-ethyl-3-carbazoyl)-vinylenyl)]-anthracene; 4,4'-bis(diphenylvinylenyl)-biphenyl; 1,4-bis(9-ethyl-3-carbazovinylene)-2-methoxy-5-(2-ethylhexyloxy)benzene; tris(benzoylacetonato)mono (phenanthroline) europium (III); tris(dibenzoylmethane) mono(phenanthroline) europium (III); tris (dibenzoylmethane)mono(5-aminophenanthroline) europium (III); tris(dinapthoylmethane)mono (phenanthroline) europium (III); tris(biphenoylmethane) mono(phenanthroline) europium (III); tris (dibenzoylmethane)mono(4,7-diphenyl phenanthroline) europium (III); tris(dibenzoylmethane)mono(4,7-dimethyl-phenanthroline)europium (III); tris(dibenzoylmethane) mono(4,7-dihydroxy-phenanthroline)europium (III); tris (dibenzoylmethane)mono(4,7-dihydroxyloxy-phenanthroline)europium (III); lithium tetra(8-hydroxyquinolinato) boron; 4,4'-bis(9-ethyl-3-carbazovinylene)-1,1'-biphenyl; bis(8-hydroxyquinolinato) zinc; bis(2-methyl-8-hydroxyquinolinato)zinc; iridium (III) tris(2-phenylpyridine); tris(8-hydroxyquinoline)aluminum; and tris[1-phenyl-3-methyl-4-(2,2-dimethylpropan-1-oyl)-pyrazolin-5-one]-terbium, many of which are commercially available from American Dye Source, Inc.

If a combination of both one or more light-emitting polymers and light-emitting molecules is to be employed, these polymers and molecules would be chosen in such a way as to provide for a functional overlap in the respective absorption and emission spectra, so as to provide the desired result. Further, these light-emitting substances are also initially chosen in a similar fashion in order to provide the desired result when combined with the chosen phosphor.

The light-emitting substance-phosphor particle may have a diameter of from about 0.05 microns to about 50 microns. Preferred are particles with a diameter of from about 10 microns to about 40 microns.

Unencapsulated phosphors may be coated with an LEP or LEM, optionally followed by encapsulation with a barrier coating.

The electroluminescent display devices of the instant invention employ organic light-emitting polymer (LEP)-phosphor particles or light-emitting molecule (LEM)-phosphor particles encapsulated with a conductive polymer or thin, insulative polymer to provide LEP and LEM stability. The encapsulated particles may be formulated into an ink system that can be printed to form a light emitting device.

Alternatively, these components may be suitably layered without encapsulation of the particle to achieve the desired result.

U.S. patent application Ser. No. 60/287,321, filed Apr. 30, 2001, for an "Electroluminescent Device Fabricated With Encapsulated Light Emitting Polymer Materials", discloses a system for fabricating an electroluminescent display device from materials including light emitting polymers (LEPs), the disclosure of which is herein incorporated by reference.

The present electroluminescent device includes an illumination layer comprising LEP-phosphor particles which have been encapsulated with a conductive polymer or thin, transparent or semi-transparent insulative polymer (for example, polyvinylbutyral, Teflon®, polyethylene, and the like).

Figure 2:
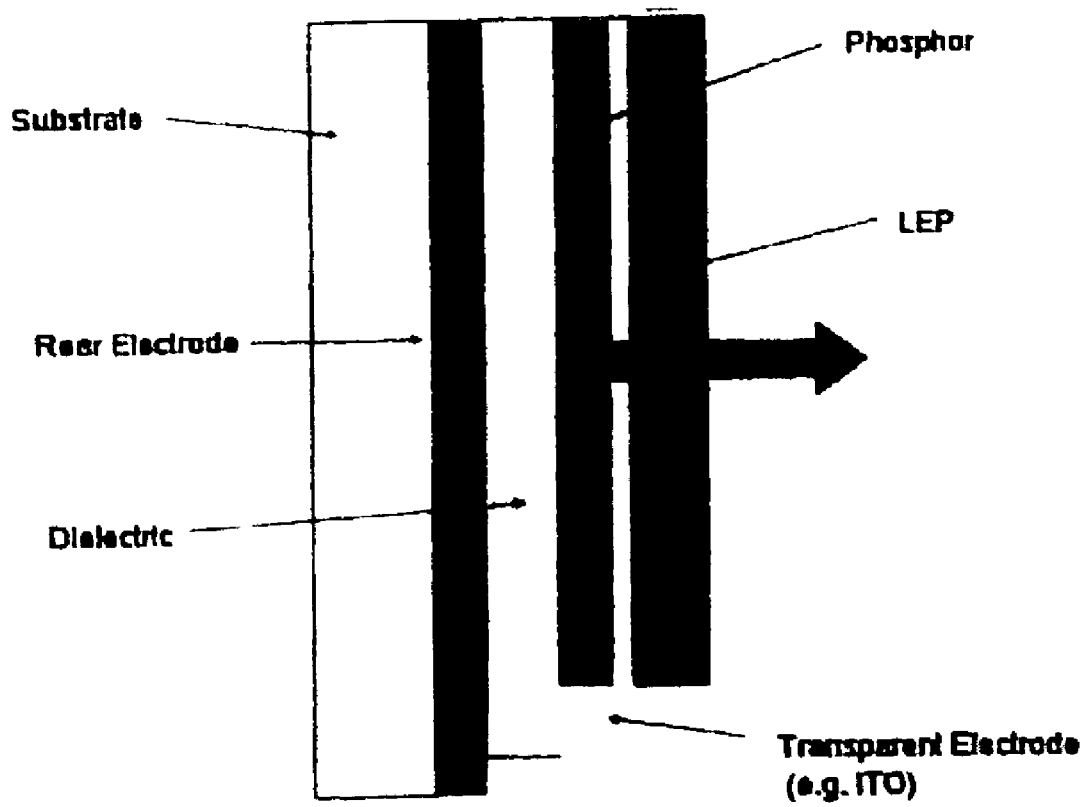
FIG. 2 illustrates a device employing an electroluminescent light-emitting polymer (LEP)-phosphor combination.
Figure 3:
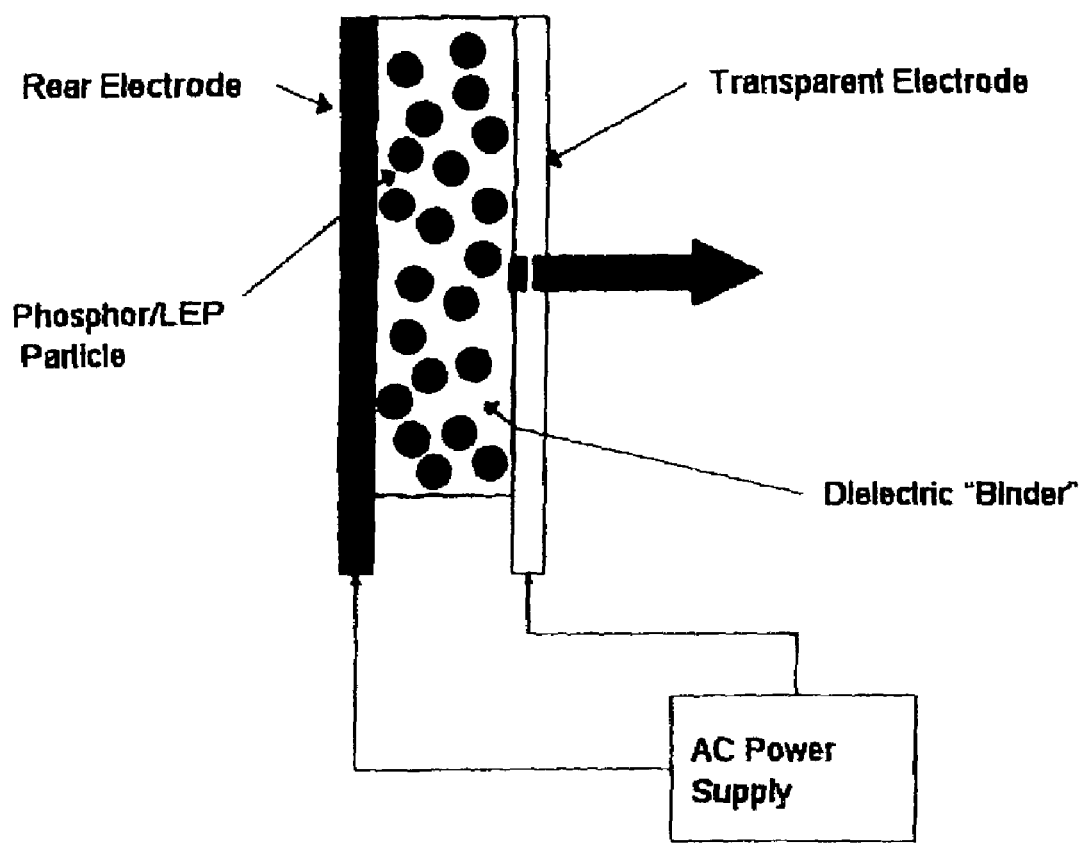
FIG. 3 illustrates a sandwich electrode configuration.

FIG. 1 provides a diagram of a light emitting polymer-phosphor particle. FIGS. 2 and 3 provide diagrams of a light emitting polymer-phosphor particle electroluminescent device.

LEP-phosphor or LEM-phosphor particles 101 are coated with a conductive polymer (for example, an inherently conductive polymer or ICP) 102 to form an encapsulated particle 103, which is suspended in an polymeric ink binder 114, to form illumination layer 104. Illumination layer 104 is sandwiched between a rear electrode layer 107 (for example, any conductive material including Ag, Mg, Al, Cu, and the like, or carbon or poly(3,4-ethylenedioxythiophene (PDOT) and the like) and a transparent electrode layer 108 (for example, polyaniline, polypyrrole, indium tin oxide, poly(3,4-ethylenedioxythiophene) and the like). Rear electrode layer 107 is situated on one surface of substrate 101. A front outlining electrode lead (FOEL) 106 is situated on the hole transporting electrode 108. At least one electrode should be transparent for the efficient transmission of the emitted light. Power connection leads (Ag or C) are attached to electron transporting layer 107 and to hole transporting layer 108.

In operation, an AC electrical potential having a frequency of between approximately 50 Hz and 1 Khz is applied across electron transporting layer 107 and hole transporting layer 108 to cause illumination of device 100.

The following Examples are provided in order to further illustrate the present invention.

EXAMPLES

Example 1

Production of a Light-emitting Polymer (LEP) Coated Phosphor Particle

Phosphor Particle Encapsulation Process:

In Step 205, phosphor particles 101 are prepared by precipitation, spray pyrolysis, spray chilling, and the like. Further reduction in particle size may be achieved by micronizing using an air mill or grinding them to an ultimate particle size of approximately 50 microns or less.

In Step 210, phosphor particles 101 are then coated with a light emitting polymer or light emitting small molecule 102, and optionally, followed by coating with a conductive polymer, or, alternatively, a thin, insulative polymer using a fluidized bed coater. LEPs such as poly(p-phenylene vinylene) or poly[2-methoxy-5-(2'-ethylhexyloxy)-1,4-phenylenevinylene] may be used.

In this process, the particles are fluidized in an air or nitrogen stream and LEP material 102 is spray coated onto the particles to form encapsulated particles 103 (LEP-phosphor particles).

In Step 215, a printing ink 104 may then be formulated by mixing the LEP encapsulated phosphor particles and binder polymers, for example, poly(methylmethacrylate) or poly (butylmethacrylate) in a suitable solvent. Other suitable binder polymers may be any suitable thermoplastic, including poly(vinylbutyral), poly(vinylalcohol), poly (vinylchloride), polycarbonate, polystyrene, poly(vinylidene chloride), poly(vinylidene fluoride), poly(acrylonitrile), poly(oxyethylene), cellulose esters, cellulose ethers, nylon 6,6, nylon 12, nylon 6,12, poly(ethylene oxide), poly(ethylene-co-vinylacetate), poly(vinylcarbazole), poly(caprolactone), polysulfone, poly(vinylpyrrolidone), poly(4-vinylphenol), poly(methyloctadecylsiloxane), and the like. Other binder systems that may be employed include systems employing thermosetting resins, for example, systems with urethane and epoxies, as well as UV-curable binder systems.

Example 2

Construction of a Device Employing an Electroluminescent Light-emitting Polymer (LEP)-Phsophor Combination Functional Stack Printing Process:

In step 220, the rear electrode 107 is printed onto a suitable substrate in the desired pattern or patterns.

In step 225, LEP-phosphor ink layer 104 is printed onto the rear electrode patterns 107.

In step 230, a transparent electrode 108 is printed onto the LEP-phosphor layer 104.

In step 235, the front outlining electrode lead (FOEL) 106 is printed onto the electrode 108. Appropriate connection leads (Ag or C) to rear electrode 107 and FOEL 106 are then printed.

The rear electrode and transparent electrode may be fabricated using conductive polymers to provide a totally polymeric system without metals or metallic compounds.

FIG. 3 shows an LEP-phosphor ink matrix formed with LEP-phosphor particles with a dielectric binder material. One method of forming this mixture is to contact a LEP-phosphor ink matrix with a suitable binder.

LEP-phosphor ink matrix may be used as layer 104 in device 100.

Figure 4:
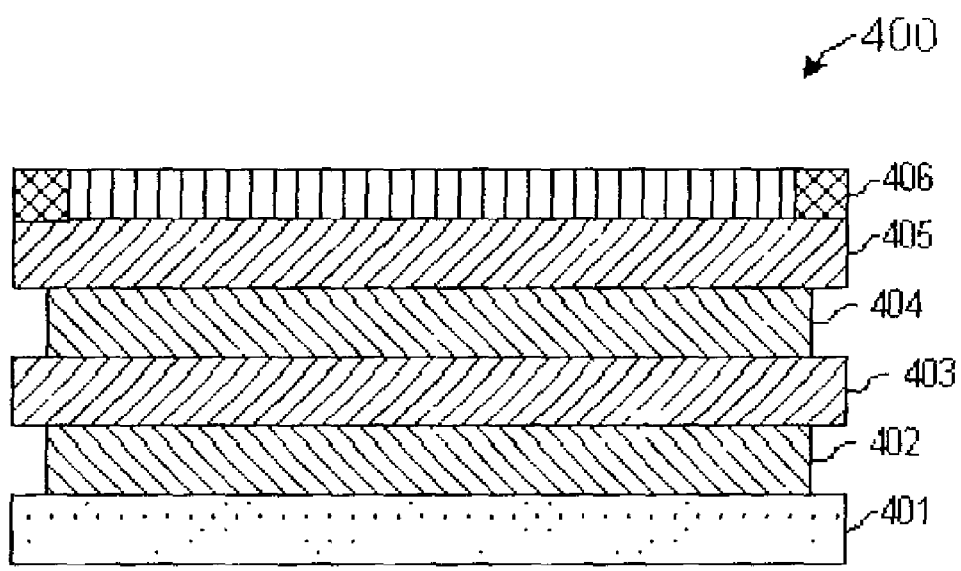
FIG. 4 illustrates an alternative embodiment of an electroluminescent display device.

FIG. 4 is a schematic illustration of an alternative embodiment of an electroluminescent (EL) multi-segment display device 400 comprising a substrate 401, a rear electrode layer 402, a dielectric layer 403, an illumination layer 404, an electrically conductive layer 405, and a front outlining electrode lead ("front electrode") 406. Substrate 401 may comprise either metal or an electrically non-conducting material. If, for example, an aluminum substrate is used, then it is first coated with an insulative material.

Rear electrode 402 is formed of an electrically conductive material, for example, silver or carbon particles. Dielectric layer 403 is formed of high dielectric constant material, such as barium titanate. Illumination layer 404 is formed of LEP-phosphor particles, as described above. Front electrode 406 may be formed of indium tin oxide (ITO), silver particles, or other electrically conductive material.

Figure 5:
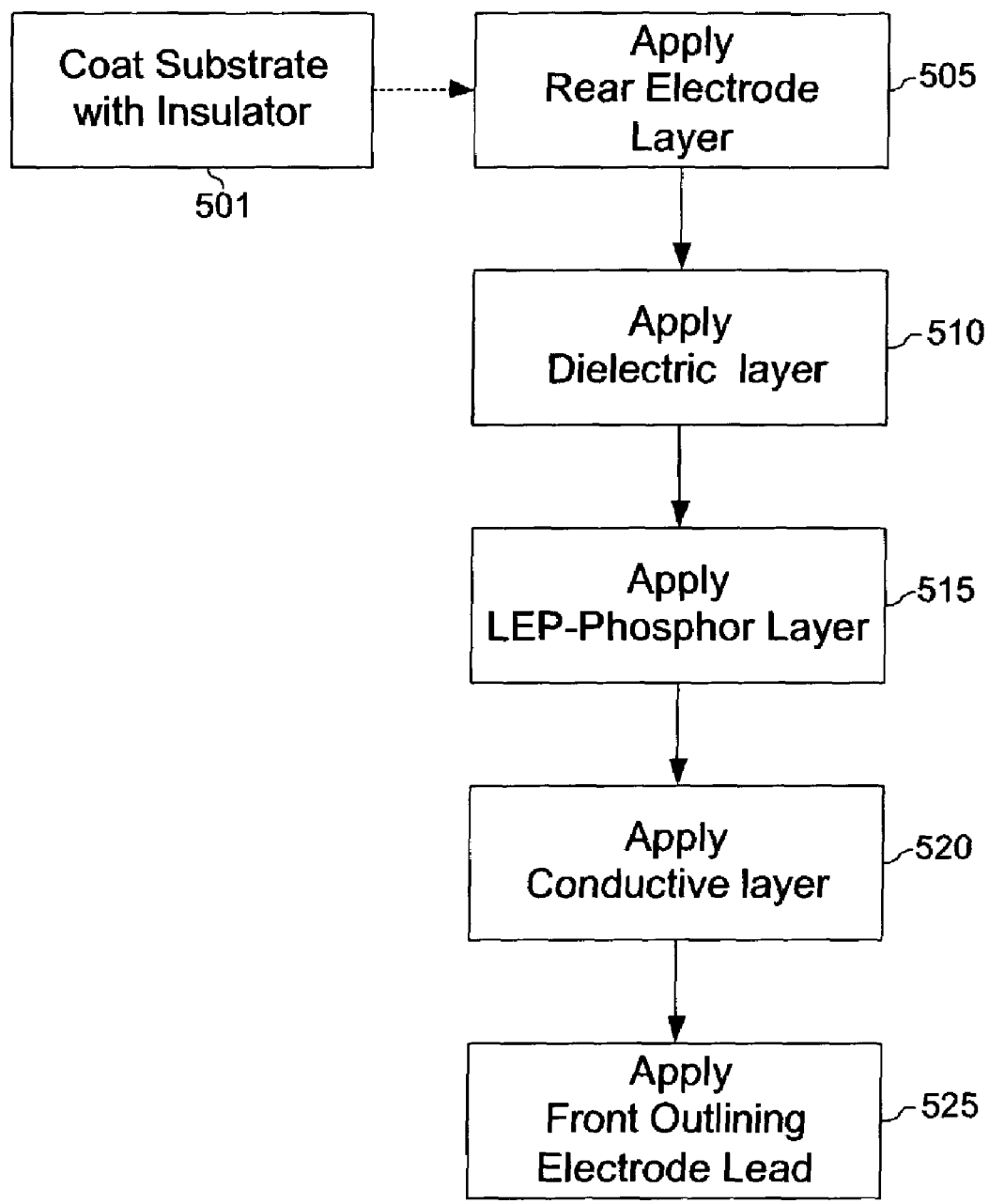
FIG. 5 illustrates a flowchart of an exemplary method for fabricating an electroluminescent device.
Figure 6:
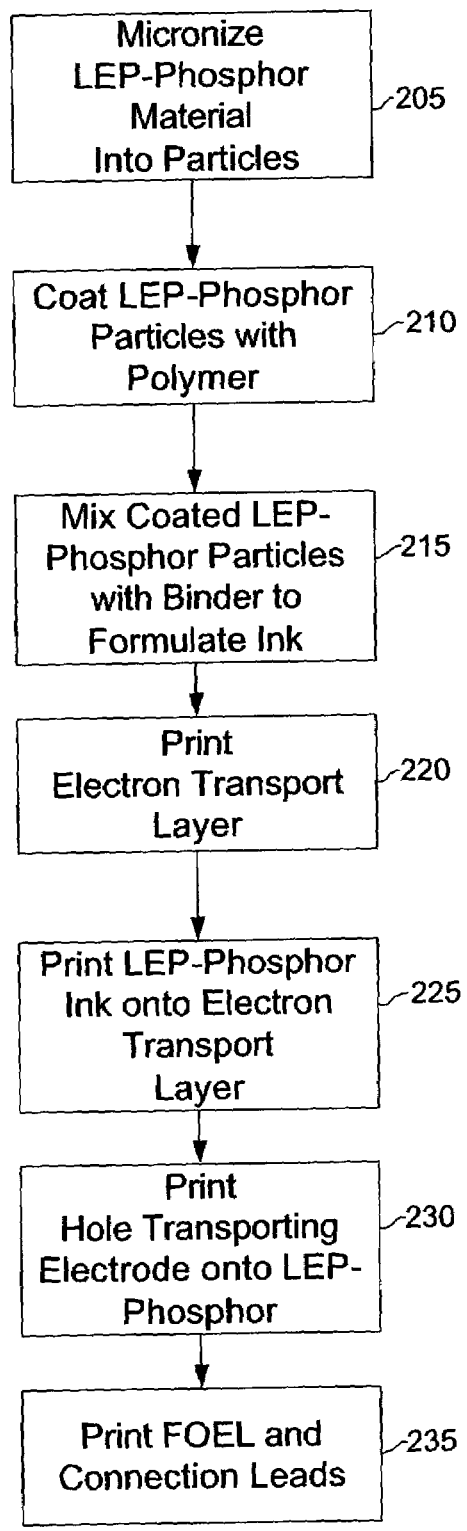
FIG. 6 illustrates an additional flowchart of an exemplary method for fabricating an electroluminescent device.

FIG. 5 is a flow chart showing an exemplary sequence of steps for fabricating the electroluminescent display device shown in FIG. 3. Fabrication of the present device 100 is best understood by viewing FIGS. 4 and 5 in conjunction with one another. If substrate 401 is a metal or other conductor, such as aluminum, then at step 501, an insulative coating is first applied over the substrate using a compound such as Nazdar's Plastic Plus (Nazdar Mid-America, St. Louis, Mo.). If substrate 401 is formed from a non-conductor, such as a polyester film, polycarbonate, or other plastic material, no coating is required.

At step 505, rear electrode 402 is applied over a front surface of substrate 401. In an exemplary embodiment, rear electrode 402 is formed of conductive particles, for example, silver or carbon, dispersed in a polymeric or other binder to form a screen printable ink. In one embodiment, rear electrode 402 may comprise a silver particle ink such as DuPont 7145. Alternatively, rear electrode 402 may comprise a conductive polymer such as polyaniline, polypyrrole, and poly(3,4-ethylenedioxythiophene). In an exemplary embodiment, a carbon rear electrode 402 may have a thickness of between approximately 0.2 millimeters and 0.6 millimeters. However, any suitable electrode thickness may be employed. It is to be noted that rear electrode layer 402, as well as each of the layers 403–406 that are successively applied in fabricating device 100, may be applied by any appropriate method, including an ink jet process, a stencil, flat coating, brushing, rolling, spraying, etc.

Rear electrode layer 402 may cover the entire substrate 401, but this layer 402 typically covers only the illumination area (the area covered by LEP layer 404, described below).

At step 510, optional dielectric layer 403 is applied over rear electrode layer 402. In an exemplary embodiment, dielectric layer 48 comprises a high dielectric constant material, such as barium titanate dispersed in a polymeric binder to form a screen printable ink. In one embodiment, the dielectric may be an ink, such as DuPont 7153. Dielectric layer 403 may cover substrate 401 either entirely, or may alternatively cover only the illumination area. Alternatively, dielectric layer 403 may include a high dielectric constant material such as alumina oxide dispersed in a polymeric binder. The alumina oxide layer is applied over rear electrode 164 and cured by exposure to UV light. In an exemplary embodiment, dielectric layer 403 may have a thickness of between approximately 20 microns and 31 microns.

In accordance with one embodiment, dielectric layer 403 has substantially the same shape as the illumination area, but extends approximately 1/16" to 1/8" beyond the illumination area. Alternatively, dielectric layer 402 may cover substantially all of substrate 401.

Figure 1A:
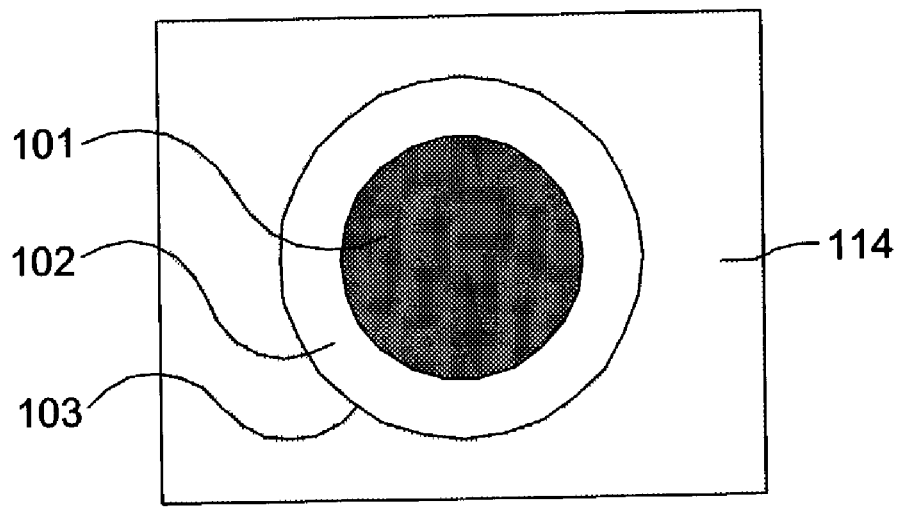
Figure 1B:
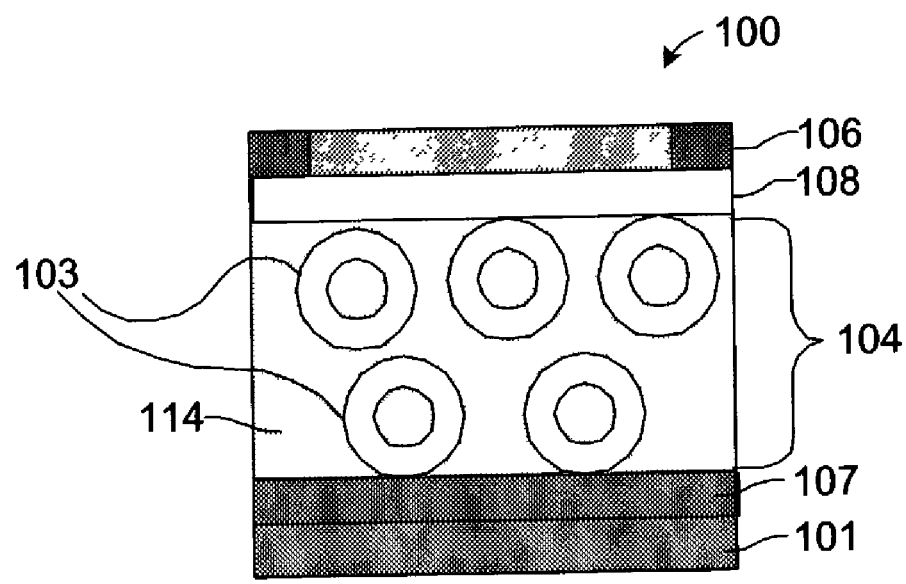
Figure 1C:
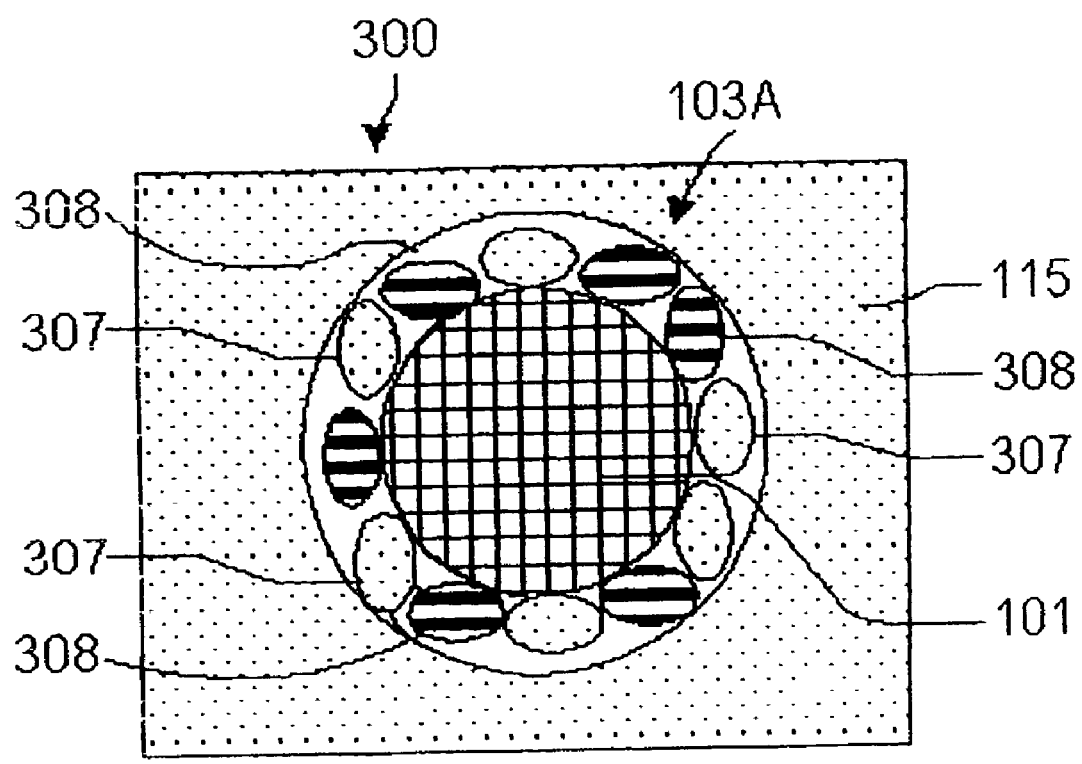

At step 515, illumination layer 404 is applied over dielectric layer 403. Illumination layer 404 is formulated in accordance with the process described above with respect to FIGS. 1A, 1B, and 2. The size of the illumination area covered by the illumination layer 404 may range from approximately 1 sq. mm to 1000 sq. cm. In an exemplary embodiment of the present system, illumination layer 404/104 comprises light-emitting polymer phosphor particles, and has a thickness of between approximately 20 microns and 31 microns.

At step 520, conductive layer 405 is printed over LEP-phosphor particle layer 404, extending about 1/16" to 1/8" beyond LEP-phosphor particle area 404. The distance beyond the Illumination layer to which conductive layer 405 extends is a function of the size of the device. Accordingly, the extension of conductive layer 405 beyond Illumination area 404 may advantageously be between approximately 2 percent and 10 percent of the width of Illumination layer 404. In an exemplary embodiment, conductive layer 405 comprises indium tin oxide (ITO) particles in the form of a screen printable ink such as DuPont 7160. In an alternative embodiment, conductive layer is non-metallic and is translucent or transparent, and comprises a conductive polymer, such as polyaniline, polypyrrole, or poly(3,4-ethylenedioxythiophene). In an exemplary embodiment, an ITO conductive layer 405 may have a thickness of between approximately 5 microns and 13 microns.

At step 525, a front electrode, or more specifically, a front outlining electrode layer 406, comprising a conductive material such as silver or carbon, is applied onto the outer perimeter of conductive layer 405 to transport electrical current thereto. Front electrode 406 is typically a 1/16" to 1/8" wide strip, approximately 2 percent to 20 percent of the width of conductive layer 405, depending on the current drawn by device 100 and the length of the device from the controller or power source. For example, front electrode 406 may be approximately 1/8" wide for a 50" wire run from the controller.

Front electrode leads 525 may be screen printed onto the conductive layer 520, or may be fabricated as interconnect tabs extending beyond the substrate to facilitate connection to a power source or controller. In one embodiment, front outlining electrode layer contacts substantially the entire outer perimeter of the conductive layer and does not overlap rear electrode. In an alternative embodiment, front electrode 406 contacts only about 25% of outer perimeter of conductive layer 405. Front electrode may be fabricated to contact any amount of the outer perimeter of conductive layer 405 from about 25% to about 100%. Front outlining electrode 406 may, for example, comprise silver particles that form a screen-printable ink, such as DuPont 7145. In an alternative embodiment, front outlining electrode 406 is non-metallic and is translucent or transparent, and comprises a conductive polymer, such as polyaniline, polypyrrole, or poly(3,4-ethylenedioxythiophene). Fabricating front and rear electrodes 406/102 with polymers such as the aforementioned compounds would make device 100 more flexible, as well as more durable and corrosion resistant. In an exemplary embodiment, a silver front outlining electrode layer 406 may have a thickness of between approximately 20 microns and 28 microns.

What is claimed is:

1. A phosphor particle having a coating that comprises a light emitting polymer wherein the coating encapsulates the phosphor particle.

2. The phosphor particle of claim 1 wherein said light-emitting polymer is selected from the group consisting of poly(p-phenylene vinylene) and poly[2-methoxy-5-(2'-ethylhexyloxy)-1,4-phenylenevinylene].

3. The phosphor particle of claim 1 wherein said phosphor particle has a diameter of from about 0.3 microns to about 50 microns.

4. The phosphor particle of claim 1 wherein said phosphor particle has a diameter of from about 10 microns to about 40 microns.

5. An electroluminescent display device comprising the phosphor particle of claim 1.

6. An electroluminescent display device comprising the phosphor particle of claim 2.

7. The phosphor particle of claim 1 wherein the light-emitting polymer is selected from the group consisting of polypyridine, poly(p-phenylene vinylene), poly[2-methoxy-5-(2'-ethylhexyloxy)-1,4-phenylenevinylene], poly[2-methoxy-5-(2-ethylhexyloxy)-1,4-phenylene-vinylene], poly[(2-methoxy-5-(2-ethylhexyloxy)-1,4-phenylene-vinylene)-alt-co-(4,4'-biphenylene-vinylene)], poly[(9,9-dioctyl-2,7-divinylenefluorenylene)-alt-co-(9,10-anthracene)], poly[(9,9-dioctyl-2,7-divinylenefluorenylene)-alt-co-(4,4'-biphenylene)], poly[{9,9-dioctyl-2,7-divinylenefluorenylene}-alt-co-{2-methoxy-5-(2-ethylhexyloxy)-1,4-phenylene}], poly[{9,9-dioctyl-2,7-bis(2- cyanovinylene-fluorenylene}-alt-co-{2-methoxy-5-(2-ethyl hexyloxy)-1,4-phenylene}], poly[2-methoxy-5-(2-ethyl hexyloxy)-1,4-(1-cyanovinylenephenylene)], poly[{9,9-di-hexyl-2,7-bis(1-cyanovinylene)fluorenylene}-alt-co-{2,5-bis(N,N'-diphenylamino)-1,4-phenylene}], poly[{9-ethyl-3, 6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butyl phenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy) benzene}], poly[{9,9-dioctylfluorenyl-2,7-diyl}-co-{1,4-(2, 5-dimethoxy)benzene}], poly[(9,9-dioctyifluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl; poly(9,9-di-hexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene)], poly[(9,9dioctylfluorenyl-2,7-diyl)-alt-co-(N,N'-diphenyl)-N,N'-di(p-butyloxy-phenyl)1,4-diaminobenzene)], poly[(9,9-dihexylfluorenyl-2,7-diyl)-co-(1,4-benzo-{2,1',3}thiadiazole)], poly[(9,9-dihexylfluorenyl-2,7-diyl)-alt-co-(9,10-anthracene)], poly[(9,9-dioctylfluorenyl-2,7-diyl)-alt-co-(N,N'-bis{4-butylphenyl}-benzidine-N,N'-{1,4-diphenylene})], poly[(9, 9-dihexylfluorenyl-2,7-diyl)-alt-co-(2-methoxy-5-{2-ethylhexyloxy}-1,4-phenylene)], poly[(9,9-dihexylfluorenyl-2,7-diyl)-co-(9,ethyl-3,6-carbazole)], poly[(9,9-dihexylfluorenyl-2,7-diyl)-alt-co-(9,ethyl-3,6-carbazole)], poly[(9,9-dihexylfluorenyl-2,7-diyl)-alt-co-(9, 9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2, 7diyl)-alt-co-(9,9-di-{5-pentanyl}-fluorenyl-2',7'-diyl)], poly[(9,9-dihexylfluorenyl-2,7-diyl)-co-(6,6'{2,2'-bipyridine})], poly[(9,9-dihexylfluorenyl-2,7-diyl)-co-(6,6'-{2,2': 6',2'-terpyridine)], poly[(9,9-dihexylfluorenyl-2,7-diyl)-co-(N,N'bis{p-butylphenyl}1,4-diamino phenylene)], poly [(9,9-dioctylfluorenyl-2,7-diyl)-co-6,6'-(2,2'bipyridine)], and poly[(9,9-dioctylfluorenyl-2,7-diyl-co-6,6"-[2,2':6',2"-terpyridine])].

8. An electroluminescent display device comprising the phosphor particle of claim 7.

9. The phosphor particle of claim 1 wherein the coating on said phosphor particles further comprises a light-emitting molecule and the coating encapulates said phosphor particle.

10. The phosphor particle of claim 9, wherein the light-emitting small molecule is selected from the group consisting of 8-hydroxyquinoline, fluorescein, rhodamine, xanthene or substituted xanthene, substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl-1-piperazinyl]-2,5'-bi-1H-benzimidazol), (2'-[4-ethoxyphenyl]-5-[4-methyl-1-piperazinyl]-2,5'-bi-1H-benzimidazol)), DAPI (4,6-diamidino-2-phenylindole), lithium tetra (2-methyl-8-hydroxyquinolinato)boron, tris (benzoylacetonato)mono(phenanthroline)europium(III), tris (2-phenylpyridine)iridium(III), tris(8-hydroxyquinolinato) gallium(III), tris(8-hydroxyquinolato) aluminum; tetra(2-methyl-8-hydroxyquinolato) boron, lithium salt, 4,4'-bis(9-ethyl-3-carbazovinylene)-1,1'-biphenyl, 9,10-di[(9-ethyl-3-carbazoyl)-vinylenyl)]-anthracene, 4,4'-bis (diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline) europium (III), tris(dibenzoylmethane)mono(phenanthroline) europium (III), tris(dibenzoylmethane)mono(5-aminophenanthroline)europium (III), tris(dinapthoylmethane) mono(phenanthroline) europium (III), tris(biphenoyl-methane)mono(phenanthroline) europium (III), tris (dibenzoylmethane)mono(4,7-diphenylphenanthroline) europium (III), tris(dibenzoylmethane)mono(4,7-dimethylphenanthroline)europium (III), tris (dibenzoylmethane)mono(4,7-dihydroxyphenanthroline) europium (III), tris(dibenzoylmethane)mono(4,7-dihydroxyloxyphenanthroline)europium (III), lithium tetra (8-hydroxyquinolinato) boron, 4,4'-bis(9-ethyl-3-carbazovinylene)-1,1'-biphenyl, bis(8-hydroxyquinolinato) zinc, bis(2-methyl-8-hydroxyquinolinato)zinc, iridium (III) tris(2-phenylpyridine), tris(8-hydroxyquinoline)aluminum, and tris[1-phenyl-3-methyl-4-(2,2-dimethylpropan-1-oyl)-pyrazolin-5-one]-terbium.

11. An electroluminescent display device comprising the phosphor particle of claim 10.

12. A method for fabricating an electroluminescent display device comprising:
 a phosphor particle having a coating that comprises a light-emitting polymer wherein the coating encapsulates the phosphor particle;
 formulating an ink by mixing the coated phosphor particles with at least one binder polymer;
 depositing a conducting rear electrode onto a substrate in a pattern;
 depositing said ink onto said rear electrode to form a layer;
 optionally depositing a transparent hole transporting electrode onto said layer; and
 depositing a front outlining electrode; and
 depositing connection leads to the rear electrode and the front outlining electrode.

13. The method of claim 12 wherein said coated phosphor particles are encapsulated with a barrier coating.

14. The method of claim 12 which further comprises a dielectric layer.

15. The method of claim 12 wherein said light-emitting polymer is selected from the group consisting of polypyridine; poly(p-phenylene vinylene); poly[2-methoxy-5-(2'-ethylhexyloxy)-1,4-phenylenevinylene]; poly[2-methoxy-5-(2-ethylhexyloxy)-1,4-phenylene-vinylene]; poly[(2-methoxy-5-(2-ethylhexyloxy)-1,4-phenylene-vinylene)-alt-co-(4,4'-biphenylene-vinylene)]; poly[(9,9-dioctyl-2,7-divinylenefluorenylene)-alt-co-(9,10-anthracene)]; poly[(9, 9-dioctyl-2,7-divinylenefluorenylene)-alt-co-(4,4'-biphenylene)]; poly[{9,9-dioctyl-2,7-divinylene-fluorenylene}-alt-co-{2-methoxy-5-(2-ethyl-hexyloxy)-1,4-phenylene}]; poly[{9,9-dioctyl-2,7-bis(2-cyanovinylene-fluorenylene}-alt-co-{2-methoxy-5-(2-ethyl hexyloxy)-1,4-phenylene}]; poly[2-methoxy-5-(2-ethylhexyloxy)-1,4-(1-cyanovinylenephenylene)]; poly[{9,9-dihexyl-2,7-bis(1-cyanovinylene)fluorenylene}-alt-co-{2,5-bis(N,N'-diphenylamino)-1,4-phenylene}]; poly[{9-ethyl-3,6-bis(2-cyanovinylene)carbazolylene)}-alt-co-{2-methoxy-5-(2-ethylhexyloxy)-1,4-phenylene}]; poly[(9,9-di(2-ethylhexyl)-fluorenyl-2,7-diyl)-co-(N,N'-diphenyl)-N,N'-di-(p-butylphenyl)-1,4-diaminobenzene]; poly[2-(6-cyano-6-methylheptyloxy)-1,4-phenylene); poly[{9,9- dioctylfluorenyl-2,7-diyl}-co-{1,4-(2,5-dimethoxy) benzene}]; poly[{9,9-dioctylfluorenyl-2,7-diyl}-co-{1,4-(2, 5-dimethoxy)benzene}]; poly[(9,9-dioctylfluorenyl-2,7-diyl)-co-(1,4-ethylenylbenzene)]; poly[(9,9-dioctylfluorenyl-2,7-diyl)-co-(1,4-diphenylene-vinylene-2-methoxy-5-{2-ethylhexyloxy}-benzene)]; poly[(9,9-dihexylfluorenyl-2,7-divinylenefluorenylene)]; poly[(9,9-dihexyl-2,7-(2-cyanodivinylene)-fluorenylene)]; poly[(9,9-dioctylfluorenyl-2,7-diyl)-co-(1,4-vinylenephenylene)]; poly[(9,9-dioctylfluorenyl-2,7-diyl)-co-(1,4-vinylenephenylene)]; poly(9,9-dioctylfluorenyl-2,7-diyl; poly(9,9-dihexylfluorenyl-2,7-diyl); poly[9,9-di-(2-ethylhexyl)-fluorenyl-2,7-diyl]; poly[(9,9-dioctylfluorenyl-2,7-diyl)-co-(N,N'-diphenyl)-N,N'-di(p-butyloxyphenyl)-1,4-diaminobenzene)]; poly[(9,9-dioctylfluorenyl-2,7-diyl)-alt-co-(N,N'-diphenyl)-N,N'-di(p-butyloxy-phenyl)1,4-deaminobenzene)]; poly[(9,9-dihexylfluorenyl-2,7-diyl)-co-(1,4-benzo-{2,1',3}-thiadiazole)]; poly[(9,9-dihexylfluorenyl-2,7-diyl)-alt-co-(9,10-anthracene)]; poly[(9,9-dioctylfluorenyl-2,7-diyl)-alt-co-(N,N'-bis{4-butylphenyl}-benzidine-N,N'-{1,4-diphenylene})]; poly[(9, 9-dihexylfluorenyl-2,7-diyl)-alt-co-(2-methoxy-5-{2-ethylhexyloxy}-1,4-phenylene)]; poly[(9,9-dihexylfluorenyl-2,7-diyl)-co-(9,ethyl-3,6-carbazole)]; poly[(9,9-dihexylfluorenyl-2,7-diyl)-alt-co-(9,ethyl-3,6-carbazole)]; poly[(9,9-dihexylfluorenyl-2,7-diyl)-alt-co-(9, 9'-spirobifluorene-2,7-diyl]; poly[(9,9-dihexylfluorenyl-2,7-diyl)-co-(2,5-p-xylene)]; poly[(9,9-dihexylfluorenyl-2,7-diyl)-co-(3,5-pyridine)]; poly[(9,9-dihexylfluorenyl-2,7-diyl)-co-(1,4-phenylene)]; poly[(9,9-dihexylfluorenyl-2,7-diyl)-alt-co-(9,9-di-{5-pentanyl}-fluorenyl-2',7'-diyl; poly[(9,9-dihexylfluorenyl-2,7-diyl)-co-(6,6'{2,2'-bipyridine})]; poly[(9,9-dihexylfluorenyl-2,7-diyl)-co-(6,6'-{2,2':6',2"-terpyridine})]; and poly[(9,9-dihexylfluorenyl-2,7-diyl)-co-(N,N'bis{p-butylphenyl}-1,4-diamino phenylene)], poly[(9, 9-dioctylfluorenyl-2,7-diyl)-co-6,6'-(2,2'bipyridine)], and poly[(9,9-dioctylfluorenyl-2,7-diyl-co-6,6"-[2,2':6',2"-terpyridine])].

16. The method of claim 12 wherein the coating on said phosphor particles further comprises a light-emitting small molecule.

17. The method of claim 16 wherein said small molecule is selected from the group consisting of 8-hydroxyquinoline, fluorescein, rhodamine, xanthene or substituted xanthene, substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl-1-piperazinyl]-2,5'-bi-1H-benzimidazol) and (2'-[4-ethoxyphenyl]-5-[4-methyl-1-piperazinyl]-2,5'-bi-1H-benzimidazol)), DAPI (4,6-diamidino-2-phenylindole), lithium tetra (2-methyl-8-hydroxyquinolinato)boron, tris(benzoylacetonato)mono (phenanthroline)europium(III), tris(2-phenylpyridine) iridium(III), tris(8-hydroxyquinolinato)gallium(III), tris(8-hydroxyquinolato) aluminum; tetra(2-methyl-8-hydroxyquinolato) boron; lithium salt; 4,4'-bis(9-ethyl-3-carbazovinylene)-1,1'-biphenyl; 9,10-di[(9-ethyl-3-carbazoyl)-vinylenyl)]-anthracene; 4,4'-bis (diphenylvinylenyl)-biphenyl; 1,4-bis(9-ethyl-3-carbazovinylene)-2-methoxy-5-(2-ethylhexyloxy)benzene; tris(benzoylacetonato)mono(phenanthroline) europium (III); tris(dibenzoylmethane)mono(phenanthroline) europium (III); tris(dibenzoylmethane)mono(5-aminophenanthroline)europium(III); tris(dinapthoylmethane) mono(phenanthroline) europium (III); tris(biphenoyl-methane)mono(phenanthroline) europium (III); tris (dibenzoylmethane)mono(4,7-diphenyl phenanthroline) europium (III); tris(dibenzoylmethane)mono(4,7-dimethyl-phenanthroline)europium (III); tris(dibenzoylmethane) mono(4,7-dihydroxy-phenanthroline)europium (III); tris (dibenzoylmethane)mono(4,7-dihydroxyloxy-phenanthroline)europium (III); lithium tetra(8-hydroxyquinolinato) boron; 4,4'-bis(9-ethyl-3-carbazovinylene)-1,1'-biphenyl; bis(8-hydroxyquinolinato) zinc; bis(2-methyl-8-hydroxyquinolinato)zinc; iridium (III) tris(2-phenylpyridine); tris(8-hydroxyquinoline)aluminum; and tris[1-phenyl-3-methyl-4-(2,2-dimethylpropan-1-oyl)-pyrazolin-5-one]-terbium.

18. A method of preparing a light-emitting substance coated phosphor particle, which comprises coating on a phosphor particle wherein the coating comprises a light-emitting polymer and a light-emitting small molecule and the coating encapsulates the phoshor particle.

19. A method for fabricating an electroluminescent display device comprising:
formulating an ink by mixing phosphor particles with at least one binder polymer;
depositing a conducting rear electrode onto a substrate in a pattern;
depositing said ink onto said rear electrode to form a layer;
depositing a layer containing a light-emitting polymer onto said layer;
optionally depositing a transparent hole transporting electrode onto said layer; and
depositing a front outlining electrode; and
depositing connection leads to the rear electrode and the front outlining electrode.

20. The method of claim 19 wherein said layer containing the light-emitting polymer further comprises a light-emitting small molecule.

21. An electroluminescent display device comprising:
a phosphor particle having a coating comprising a light emitting polymer wherein the coating encapsulates the phosphor particle;
an ink comprising said coated phosphor particles and at least one binder polymer;
a conducting rear electrode on a substrate in a pattern;
said ink deposited onto said rear electrode;
an optional transparent hole transporting electrode;
a front outlining electrode; and
connection leads to the rear electrode and the front outlining electrode.

22. The device of claim 21 wherein said coated phosphor particles are encapsulated with a barrier coating.

23. The device of claim 21 which further comprises a dielectric layer.

24. The device of claim 21 wherein the coating on the phosphor particle further comprises a light-emitting small molecule.

25. An electroluminescent display device comprising:
an ink formulated by mixing phosphor particles with at least one binder polymer;
a conducting rear electrode deposited onto a substrate in a pattern;
said ink deposited onto said rear electrode;
a layer containing a light-emitting polymer;
an optional transparent hole transporting electrode;
a front outlining electrode deposited onto said hole transporting electrode; and
connection leads to the rear electrode and the front outlining electrode.

26. The device of claim 25 wherein said phosphor particles are encapsulated with a barrier coating.

27. The device of claim 25 which further comprises a dielectric layer.

28. The device of claim 25 wherein the layer containing a light-emitting polymer further contains a light-emitting small molecule.

29. The device of claim 28 wherein said light-emitting small molecule is selected from the group consisting of 8-hydroxyquinoline, fluorescein, rhodamine, xanthene or substituted xanthene, substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl-1-piperazinyl]-2,5'-bi-1H-benzimidazol), (2'-[4-ethoxyphenyl]-5-[4-methyl-1-piperazinyl]-2,5'-bi-1H-benzimidazol)), DAPI (4,6-diamidino-2-phenylindole), lithium tetra (2-methyl-8-hydroxyquinolinato)boron, tris (benzoylacetonato)mono(phenanthroline)europium(III), tris (2-phenylpyridine)iridium(III), tris(8-hydroxyquinolinato) gallium(III), tris(8-hydroxyquinolato) aluminum; tetra(2-methyl-8-hydroxyquinolato) boron, lithium salt, 4,4'-bis(9-ethyl-3-carbazovinylene)-1,1'-biphenyl, 9,10-di[(9-ethyl-3-carbazoyl)-vinylenyl)]-anthracene, 4,4'-bis (diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline) europium (III), tris(dibenzoylmethane)mono(phenanthroline) europium (III), tris(dibenzoylmethane)mono(5-aminophenanthroline)europium (III), tris(dinapthoylmethane) mono(phenanthroline) europium (III), tris(biphenoylmethane)mono(phenanthroline) europium (III), tris (dibenzoylmethane)mono(4,7-diphenylphenanthroline) europium (III), tris(dibenzoylmethane)mono(4,7-dimethylphenanthroline)europium (III), tris (dibenzoylmethane)mono(4,7-dihydroxyphenanthroline) europium (III), tris(dibenzoylmethane)mono(4,7-dihydroxyloxyphenanthroline)europium (III), lithium tetra (8-hydroxyquinolinato) boron, 4,4'-bis(9-ethyl-3-carbazovinylene)-1,1'-biphenyl, bis(8-hydroxyquinolinato) zinc, bis(2-methyl-8-hydroxyquinolinato)zinc, iridium (III) tris(2-phenylpyridine), tris(8-hydroxyquinoline)aluminum, and tris[1-phenyl-3-methyl-4-(2,2-dimethylpropan-1-oyl)-pyrazolin-5-one]-terbium.

30. The device of claim 21 wherein the light-emitting polymer is selected from the group consisting of polypyridine, poly(p-phenylene vinylene), poly[2-methoxy-5-(2'-ethylhexyloxy)-1,4-phenylenevinylene], poly[2-methoxy-5-(2-ethylhexyloxy)-1,4-phenylene-vinylene], poly[(2-methoxy-5-(2-ethylhexyloxy)-1,4-phenylene-vinylene)-alt-co-(4,4'-biphenylene-vinylene)], poly[(9,9-dioctyl-2,7-divinylenefluorenylene)-alt-co-(9,10-anthracene)], poly[(9,9-dioctyl-2,7-divinylenefluorenylene)-alt-co-(4,4'-biphenylene)], poly[{9,9-dioctyl-2,7-divinylenefluorenylene}-alt-co-{2-methoxy-5-(2-ethylhexyloxy)-1,4-phenylene}], poly[{9,9-dioctyl-2,7-bis(2-cyanovinylene-fluorenylene}-alt-co-{2-methoxy-5-(2-ethyl hexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3,6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butyl phenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy) benzene}], poly[{9,9-dioctylfluorenyl-2,7-diyl}-co-{1,4-(2, 5-dimethoxy)benzene)}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-diyl)-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylephenylene)], poly(9,9-dioctylfluorenyl-2,7-diyl; poly(9,9-dihexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene)], poly[(9,9-dioctylfluorenyl-2,7-diyl)-alt-co-(N,N'-diphenyl)-N,N'- di(p-butyloxy-phenyl)1,4-diaminobenzene)], poly[(9,9-dihexylfluorenyl-2,7-diyl)-co-(1,4-benzo-{2,1',3}-thiadiazole)], poly[(9,9-dihexylfluorenyl-2,7-diyl)-alt-co-(9,10-anthracene)], poly [(9,9-dioctylfluorenyl-2,7-diyl)-alt-co-(N,N'-bis{4-butylphenyl}-benzidine-N,N'-{1,4-diphenylene})], poly[(9, 9-dihexylfluorenyl-2,7-diyl)-alt-co-(2-methoxy-5-{2-ethylhexyloxyl-1,4-phenylene)], poly[(9,9-dihexylfluorenyl-2,7-diyl)-co-(9,ethyl-3,6-carbazole)], poly [(9,9-dihexylfluorenyl-2,7-diyl)-alt-co-(9,ethyl-3,6-carbazole)], poly[(9,9-dihexylfluorenyl-2,7-diyl)-alt-co-(9, 9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl)], poly [(9,9-dihexylfluorenyl-2,7-diyl)-co-(6,6'2,2'-bipyridine})], poly[(9,9-dihexylfluorenyl-2,7-diyl)-co-(6,6'-{2,2':6',2"-terpyridine})], poly[(9,9-dihexylfluorenyl-2,7-diyl)-co-(N, N'bis{p-butylphenyl}-1,4-diamino phenylene)], poly[(9,9-dioctylfluorenyl-2,7-diyl)-co-6,6'-(2,2'bipyridine)],and poly [(9,9-dioctylfluorenyl-2,7-diyl-co-6,6"-[2,2':6',2"-terpyridine])].

31. The device of claim 25 wherein said polymer is selected from the group consisting of polypyridine, poly(p-phenylene vinylene), poly[2-methoxy-5-(2'-ethylhexyloxy)-1,4-phenylenevinylene], poly[2-methoxy-5-(2-ethylhexyloxy)-1,4-phenylene-vinylene], poly[(2-methoxy-5-(2-ethylhexyloxy)-1,4-phenylene-vinylene)-alt-co-(4,4'-biphenylene-vinylene)], poly[(9,9-dioctyl-2,7-divinylenefluorenylene)-alt-co-(9,10-anthracene)], poly[(9, 9-dioctyl-2,7-divinylenefluorenylene)-alt-co-(4,4'-biphenylene)], poly[{9,9-dioctyl-2,7-divinylenefluorenylene}-alt-co-{2-methoxy-5-(2-ethylhexyloxy)-1,4-phenylene}], poly[{9,9-dioctyl-2,7-bis(2-cyanovinylene-fluorenylene}-alt-co-{2-methoxy-5-(2-ethyl hexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3, 6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butyl phenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy) benzene}], poly[{9,9-dioctylfluorenyl-2,7-diyl}-co-{1,4-(2, 5-dimethoxy)benzene)}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy -5-{2-ethylhexyloxy}-benzene)], poly[(9,9-dihexylfluorenyl-2,7-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl; poly(9,9-dihexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene)], poly[(9,9-dioctylfluorenyl-2,7-diyl)-alt-co-(N,N'-diphenyl)-N,N'-di(p-butyloxy-phenyl)1,4-diaminobenzene)], poly[(9,9-dihexylfluorenyl-2,7-diyl)-co-(1,4-benzo-{2,1',3}-thiadiazole)], poly[(9,9-dihexylfluorenyl-2,7-diyl)-alt-co-(9,10-anthracene)], poly[(9,9-dioctylfluorenyl-2,7-diyl)-alt-co-(N,N'-bis{4-butylphenyl}-benzidine-N,N'-{1,4-diphenylene})], poly[(9,9-dihexylfluorenyl-2,7-diyl)-alt-co-(2-methoxy-5-{2-ethylhexyloxy}-1,4-phenylene)], poly[(9,9-dihexylfluorenyl-2,7-diyl)-co-(9,ethyl-3,6-carbazole)], poly[(9,9-dihexylfluorenyl-2,7-diyl)-alt-co-(9,ethyl-3,6-carbazole)], poly[(9,9-dihexylfluorenyl-2,7-diyl)-alt-co-(9,9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl)], poly[(9,9-dihexylfluorenyl-2,7-diyl)-co-(6,6'{2,2'-bipyridine})], poly[(9,9-dihexylfluorenyl-2,7-diyl)-co-(6,6'-{2,2':6',2"terpyridine})], poly[(9,9-dihexylfluorenyl-2,7-diyl)-co-(N,N'bis{p-butylphenyl}-1,4-diamino phenylene)], poly[(9,9-dioctylfluorenyl-2,7-diyl)-co-6,6'-(2,2'bipyridine)], and poly[(9,9-dioctylfluorenyl-2,7-diyl-co-6,6"-[2,2':6',2"-terpyridine])].

* * * * *

UNITED STATES PATENT AND TRADEMARK OFFICE
CERTIFICATE OF CORRECTION

PATENT NO. : 7,029,763 B2
APPLICATION NO. : 10/207576
DATED : April 18, 2006
INVENTOR(S) : Patrick J. Kinlen and Matthew Murasko It is certified that error appears in the above-identified patent and that said Letters Patent is hereby corrected as shown below:

Title Page,
(75) Inventor: insert -- Matthew Murasko, Manhattan Beach, CA (US) -- after "Fenton, MO (US)".

Column 6:
Line 22, replace "Phsophor" with -- Phosphor --.

Column 9:
Line 13, replace "-dioctyifluorenyl-" with -- dioctylfluorenyl- --.
Line 52, replace "particles" with -- particle --.
Line 52, insert -- small -- between "light-emitting" and "molecule".

Column 10:
Line 28, insert -- providing -- before "a phosphor particle".

Column 11:
Line 17, replace "deaminobenzene)]" with -- diaminobenzene)] --.

Column 12:
Line 13, insert -- forming a -- between "comprises" and "coating".

Signed and Sealed this

Twenty-sixth Day of September, 2006

JON W. DUDAS
*Director of the United States Patent and Trademark Office*